(12) United States Patent
Wilm et al.

(10) Patent No.: US 6,190,942 B1
(45) Date of Patent: Feb. 20, 2001

(54) METHOD AND CONNECTION ARRANGEMENT FOR PRODUCING A SMART CARD

(75) Inventors: Robert Wilm, Kasseburg; Detlef Houdeau, Langquaid; Robert Reiner, Neubiberg; Rainer Rettig, Umkirch, all of (DE)

(73) Assignees: PAV Card GmbH; Siemens AG; EVC Rigid Film GmbH, all of (DE)

( * ) Notice: Under 35 U.S.C. 154(b), the term of this patent shall be extended for 0 days.

(21) Appl. No.: 09/284,228

(22) PCT Filed: Sep. 22, 1997

(86) PCT No.: PCT/EP97/05197

§ 371 Date: Jun. 9, 1999

§ 102(e) Date: Jun. 9, 1999

(87) PCT Pub. No.: WO98/15916

PCT Pub. Date: Apr. 16, 1998

(30) Foreign Application Priority Data

Oct. 9, 1996 (DE) .............................................. 196 41 650
Oct. 31, 1996 (DE) .............................................. 196 45 067

(51) Int. Cl.$^7$ ................................................ H01L 21/44
(52) U.S. Cl. .......................... 438/107; 438/108; 438/612
(58) Field of Search .................................... 257/679, 786, 257/678; 438/107, 106, 125, 108, 612, 613; 29/25; 315/277, 307, 308

(56) References Cited

U.S. PATENT DOCUMENTS

| | | | |
|---|---|---|---|
| 5,681,356 | * 10/1997 | Barak et al. | 29/25 |
| 5,939,838 | * 8/1999 | Janik | 315/277 |
| 5,953,623 | * 9/1999 | Boyko et al. | 438/612 |
| 5,969,415 | * 10/1999 | Prancz | 257/679 |

* cited by examiner

*Primary Examiner*—David Nelms
*Assistant Examiner*—Phuc Trong Dang
(74) *Attorney, Agent, or Firm*—St. Onge Steward Johnston & Reens LLC

(57) ABSTRACT

The invention concerns a process and a connecting arrangement for producing a chip card, wherein a semiconductor chip on a module is fitted in an opening in a card carrier with the attainment of an electrical and mechanical connection. In accordance with the invention, in place of connections which were hitherto necessary involving a force-locking relationship and/or involving the materials being bonded together, recourse is made to inductive and/or capacitive coupling between the module and the IC-card. For that purpose the module and the card correspondingly have coils and/or capacitive coupling surfaces for signal transmission purposes.

18 Claims, 3 Drawing Sheets

METHOD AND CONNECTION ARRANGEMENT FOR PRODUCING A SMART CARD

FIELD OF THE INVENTION

The invention concerns a process for producing a chip card, wherein a semiconductor chip on a module is fitted in an opening in a card carrier with the attainment of a suitable electrical and mechanical connection, and a connecting arrangement for producing a chip card of that kind.

BACKGROUND OF THE INVENTION

In a known process for producing a chip card, in particular a card in which there are both means for contact-less data transmission and also a galvanic contact plane, a module which includes a semiconductor chip is fitted into a card body.

The module is preferably inserted into an opening in the card body and laminated to the card body by means of joining or the like, thereby obtaining a suitable mechanical and electrical connection.

An electrically conducting connection between the module and the card body or contacts disposed on the card body, which are in contact with a coil for making a contact-less communication with the surroundings, is afforded for example by virtue of the fact that an anisotropic conducting adhesive is applied in the region of the terminal locations and/or the connecting locations of the respective means for contact-less data transmission and the adhesive is compressed or compacted at least in the region of the terminal locations to such an extent that an electrically conducting bridge is produced.

In the case of an adhesive with conducting particles, the result of this is that the particles are in contact with each other in the region between the terminal locations and the means for contact-less data transmission, thereby resulting in the conducting connection.

The modules which are used in the production of chip cards generally have recourse to a plastic material carrier on which is arranged the semiconductor chip referred to above, possibly provided with ISO-contact surfaces. The module which is prefabricated in that way is connected to the card carrier which for example can comprise polycarbonate. That connecting operation or the step of inserting the module into the card body in a for example milled opening is usually effected by employing a glueing process, using a hot or melt adhesive.

In the situation where the aim is to produce combination cards which are suitable both for contact-less and for contact-mode use, or contact-less cards, a further contact plane with terminal locations for the induction loop must be provided. Those terminal locations are preferably disposed in a raised relationship on the surface of the module and/or on the surface or at the side faces of the opening in the card carrier. In the case of arrangements of that kind, it is then possible to effect the operation of glueing the modules and the card carriers by means of the procedure for making the electrically conducting connection, in one working operation. It has been found however that the required temperature and time conditions for producing both electrical and mechanical connections which are reliable involves close tolerances so that, in the case of process parameters which are not at their optimum, the long-term stability of cards which are produced in that way is reduced and, by virtue of the dimensions and the plastic properties of the module and of the card carrier, warping phenomena and stresses occur in the card, with the consequence of resulting in disturbed electrical connections, that is to say a lower level of reliability.

The same applies in regard to force-locking connections, for example by means of a spring element. Admittedly in this case warping or stresses can be accommodated by contact spring elements, but problems arise in regard to surface corrosion of the contacts.

OBJECTS OF THE INVENTION

The object of the present invention is to provide a process for producing a chip card and a connecting arrangement for a production process of that kind, with which a semiconductor chip disposed on a module can be both electrically and also mechanically contacted with a high level of reliability into an opening in a card body, wherein the resulting overall arrangement is to ensure a high degree of long-term stability and reliability of the chip card.

The object of the invention is attained by a process as set forth in claim 1, claim 4 or claim 5 and a connecting arrangement as set forth by the features of claims 7, 9 or 10, while the appendant claims embrace at least desirable configurations or developments.

SUMMARY OF THE INVENTION

The basic concept of the invention, in terms of the which process, provides that the module to be implanted into the opening in the card electrically interacts not directly but indirectly with the card carrier or an induction coil present in the card carrier for making a contact-less connection with the surroundings.

In a first embodiment of the invention the module to be implanted in the opening in the card has a first coil, wherein that first coil is inductively connected to a second coil disposed in or at the opening in the card carrier. The second coil is then in contact in per se known manner with a third (antenna) coil in the chip card, for making a contact-less connection with the surroundings. The second and third coils can also form a common coil.

In accordance with a second embodiment of the process according to the invention the module to be implanted in the opening in the card is provided with at least one first capacitive coupling surface, wherein first capacitive coupling surface electrically interacts with a second capacitive coupling surface in the opening in the card carrier. The second capacitive coupling surface results in a per se known induction coil for making a contact-less connection with the surroundings.

A third embodiment of the process according to the invention now involves both a capacitive coupling between the module to be implanted and the card carrier and also an inductive coupling, thus affording optimum data and signal transmission between module or semiconductor chip and the card carrier.

In a preferred development of the invention the module carrying the chip is provided with a special metallization plane which is in the form of an induction coil. In the operation of assembling the module in the opening in the contact surface that induction coil is brought into relationship with a coil disposed in the opening, for inductive coupling. The coil disposed in the opening in the card carrier can be a component of the per se known induction coil for electrical contacting to the exterior.

In accordance with the invention, to enhance the degree of coupling between the inductive elements, that is to say the first and second coils, it is proposed that the module at least partially and/or the card carrier, in the region of the second coil, is provided with highly permeable doping substances, or that a highly permeable coating is applied. Preferably, finely granulated rare earth magnets which are set to a suitable grain size can be used for that purpose. Per se known titanates and ferrite materials are also suitable for enhancing permeability.

It is in accordance with the invention that the first and second coils can be embodied both in the form of a wire coil or in a printed or additively applied form. It is also possible to envisage etching out coil turns or burning them out of a metallisation layer by using a laser.

The first coil in the module or the first capacitive coupling surface can be applied to the side which is directed inwardly relative to the card carrier or can also be disposed on an intermediate carrier which, with a suitable insulating intermediate layer, serves to receive ISO-external contacts.

In terms of the connecting arrangement, for the production of a chip card comprising a module with a semiconductor chip and a card carrier with an opening for receiving the module on or in the insertion side of the module a first coil is formed which is electrically connected to connections or terminals of the semiconductor chip. Disposed in or on the opening in the card carrier is a second coil wherein after insertion of the module into the opening in the card carrier a desired inductive coupling is implemented between the first and second coils. The second coil is connected to a third coil for making a contact-less connection to the surroundings. It is in accordance with the invention that the second and third coils can be in the form of a unitary coil with different turns portions, wherein a smaller turns portion is disposed in the region of the opening and a larger turns portion extends in an outer edge portion of the card carrier.

A particularly advantageous embodiment of the first coil is one such that it is arranged to act as a stiffening frame at the outside edge of the module. That increases the degree of stiffness of the module, whereby pressure forces can be better carried, in particular in the operation for laminating the module into the opening in the card carrier.

In regard to the connecting arrangement, it is further proposed that capacitive coupling surfaces be provided on the module to be implanted on the one hand and in the opening in the card carrier on the other hand.

In regard to the connecting arrangement, as a supplemental feature there is the possibility of the combination of both inductive and also capacitive coupling elements which permit the desired electrical connection and the appropriate signal information interchange between module and card carrier or the inductive elements of the card carrier.

BRIEF DESCRIPTION OF THE DRAWINGS

The invention is to be described in greater detail hereinafter by means of an embodiment and with reference to Figures in which.

DETAILED DESCRIPTION OF THE INVENTION

Figure 1:
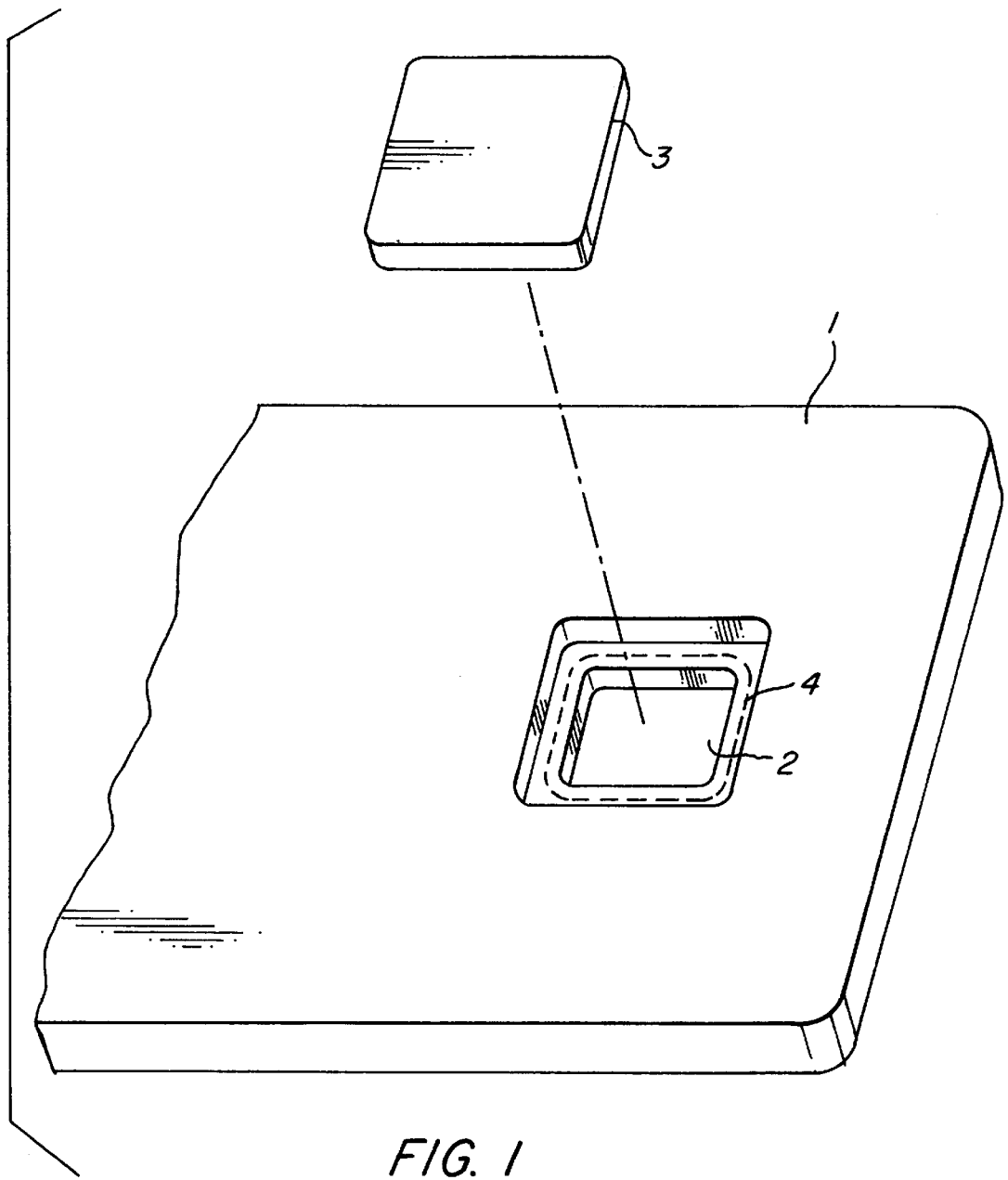
FIG. 1 shows a perspective view illustrating the principle of a card carrier with opening for accommodating a chip module.

The view shown in FIG. 1 is based on an IC-card 1 having an opening 2 for receiving a chip module 3. A second coil 4 is disposed on or in the carrier in the region of the opening 2 in the IC-card 1, the second coil 4 serving for inductive coupling to a first coil 5 (FIG. 2).

Per se known lamination and glueing procedures can be utilised for inserting the module 3 into the opening 2 and chip-contacting thereof. In contrast to the known art however in accordance with the illustrated embodiment the desired electrical connection between the chip module 3 and the second coil 4 in the IC-card 1 is purely inductively achieved. Mechanical stresses or minimal variations in the positional relationship between the IC-card 1 and the chip module 3 do not result in worse electrical connections, for example due to an increase in the contact resistance at the connecting points between the module and the antenna.

Figure 2:
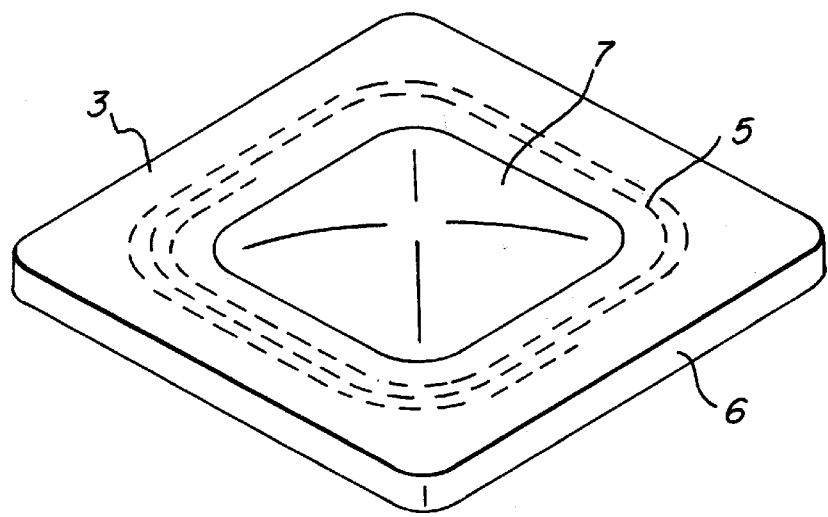
FIG. 2 shows a view of a chip module with the formation of an induction coil.

The chip module 3 shown in FIG. 2 is based on a known substrate carrier 6 provided with a so-called bare chip. In addition, disposed in or on the substrate carrier 6 is the first coil 5 which is electrically connected to the corresponding terminals of the chip. The chip itself is provided with a cover 7, for example of silicone rubber.

The substrate carrier 6 can be provided on its side opposite the chip with per se known ISO-contacts, for contact-mode connection to the exterior. In this respect supplemental attention is directed to FIGS. 4b and 4c.

Figure 3:
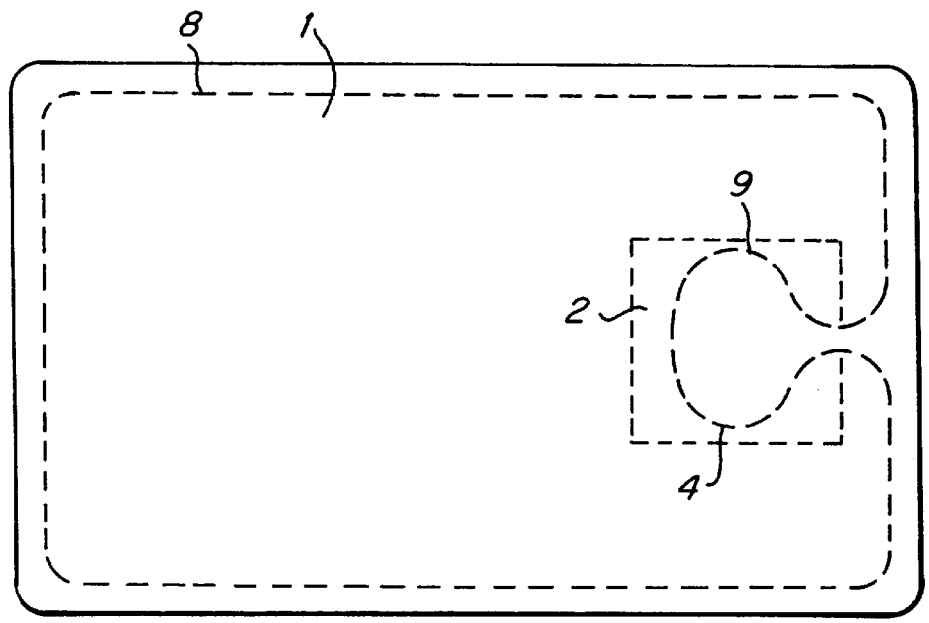
FIG. 3 is a view illustrating the principle of the chip card with coil for making a contact-less connection to the surroundings and an inner coil for inductive coupling to the further coil disposed on the chip module.
Figure 3A:
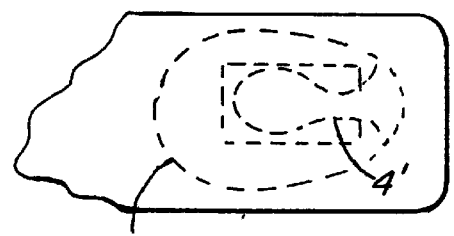
FIG. 3a is a view illustrating a card carrier having two separate coils.

An advantageous embodiment of the IC-card 1 with an inductive coupling coil for making a wireless connection to the surroundings will now be described with reference to FIG. 3.

The outer inductive coupling coil 8 has a coil portion 9 which forms the second coil 4 in the region of the opening 2.

Figure 5:
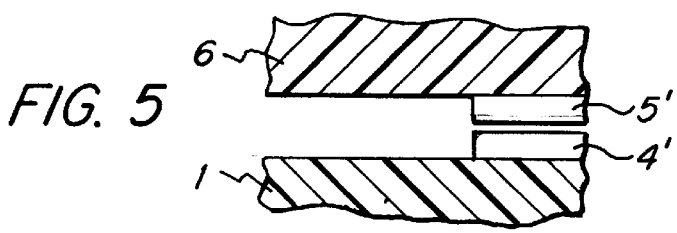
FIG. 5 is a view illustrating another embodiment of the invention.

In addition or alternatively both the substrate carrier 6 and also the oppositely disposed region of the IC-card 1 can be provided with capacitive coupling surfaces on the mutually opposite surfaces (as shown in FIG. 5) in the region of the opening 2 of the IC-card 1 so that the arrangement also affords a capacitive connection, besides a desired inductive coupling action.

Figure 4A:
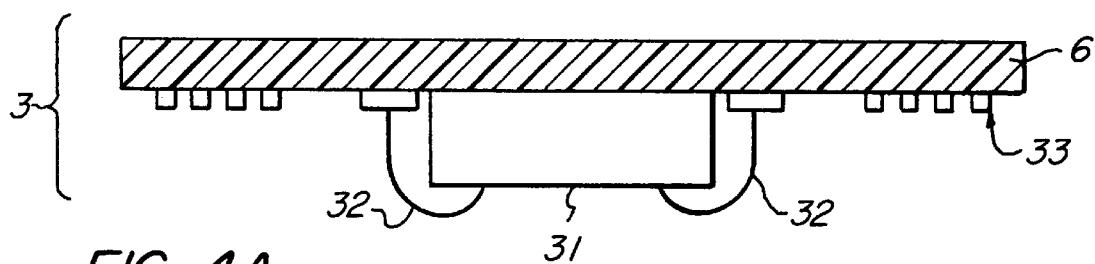
FIGS. 4a–c show various alternative forms of a module with an inductive coupling element.

FIG. 4a shows a view in cross-section of a chip module 3 with chip 31, chip contacts 32 and coil turns 33. This module is inserted face-down into the corresponding opening 2 in the IC-card 1, in which respect the coil turns 33 are possibly insulated with respect to the oppositely disposed turns of the second coil 4.

Figure 4B:
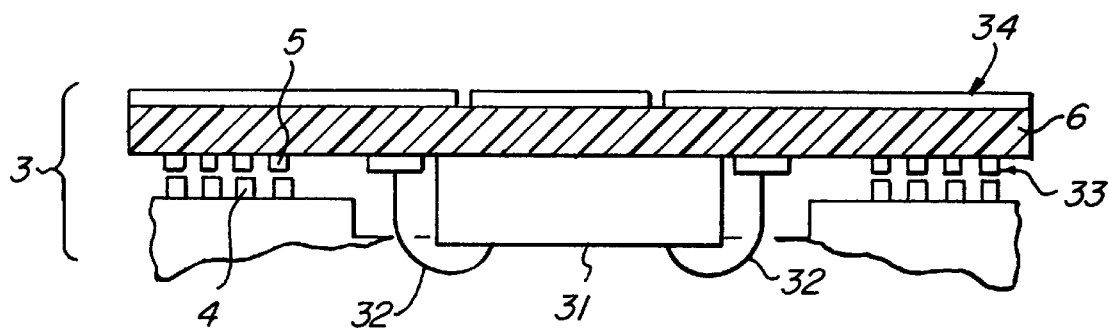
Figure 4C:
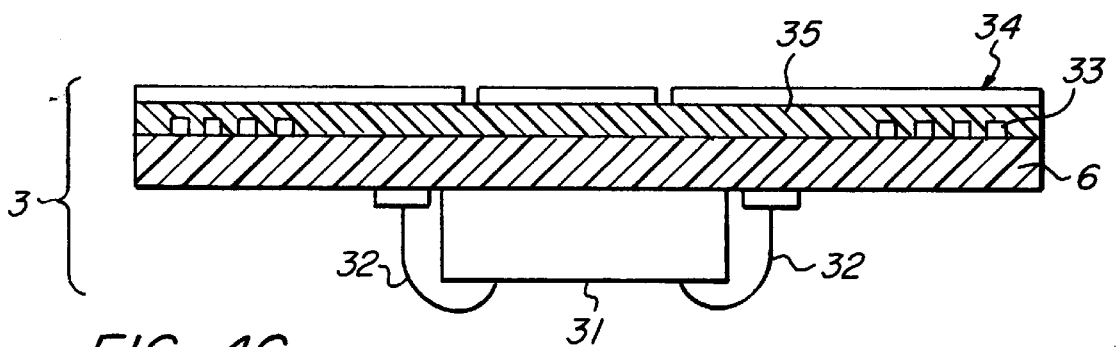

In the embodiment shown in FIG. 4b the substrate carrier 6 is provided with its upwardly facing, outwardly directed side with ISO-contacts 34 which are electrically connected to the chip 31 in a manner not shown in detail in the drawing. The ISO-contacts 34 serve for making a contact-mode connection of the IC-card to the exterior. The embodiment of the connecting arrangement or the chip module 3 shown in FIG. 4c is based on an intermediate carrier 35 which serves to receive the coil turns 33 and the ISO-contacts 34. The intermediate carrier 35 can in turn be connected to the substrate carrier 6, for example by lamination. In the case of the arrangement illustrated in FIG. 4c, it is possible to forego additional electrical insulation of the coil turns 33 as either they are embedded in the intermediate carrier 35 or they are insulated by the substrate carrier 6.

To improve the inductive coupling effect regions of the substrate carrier, the intermediate carrier and/or corresponding portions in the opening in the IC-card can be provided with highly permeable additives or a suitable coating can be applied in the region of the first and second coils.

In accordance with a further embodiment the first coil of the module to be implanted can act as a stiffening frame and in that sense can form an integral component of the chip carrier so that forces occurring when the module is pressed into the opening are more easily absorbed and carried or the occurrence of undesirable deformation of the module upon being inserted and pressed into position is avoided from the outset.

In principle it should be noted that there is no need for first and second coils to be in spatially coincident relationship. On the contrary, the primary matter is to ensure adequate inductive coupling between the coils.

All in all the present invention makes it possible to eliminate the disadvantages of known electrical contacting arrangements involving parts being held together by the application of force or by the materials thereof being bonded together, insofar as signal transmission between chip and actual IC-card has recourse to inductive and/or capacitive coupling. That reduces expenditure levels when fitting the module by virtue of the avoidance of expensive and complicated adjustment operations and cost levels can be reduced at the manufacturing end as the use of expensive special glues which are intended to provide both an electrical and also a mechanical connection can be avoided.

What is claimed is:

1. A connecting arrangement for producing a chip card comprising a module having a semiconductor chip and a card carrier with an opening for receiving the module, characterized in that formed with the module is a first coil which is electrically connected to terminals of the semiconductor chip and that formed with the card carrier is a second coil, wherein after insertion of the module into the opening an inductive coupling results and that in addition there is an electrical connection to a third coil provided in the card carrier for wireless interconnecting with the surroundings.

2. A process for producing a chip card comprising the steps of:
   providing an opening in a card carrier;
   providing a region of the card carrier surrounding said opening with a first coil;
   providing a module carrying a semiconductor chip with a second coil which is electrically connected to the semiconductor chip; and
   fitting the module in the opening of the card carrier, thereby attaching the module and the card carrier to each other to inductively couple the first and second.

3. The process defined in claim 2, further comprising the step of providing the card carrier with a third coil, thereby wirelessly coupling the second coil of the module with the third coil.

4. The process defined in claim 3 wherein the third coil is spaced apart from the first coil.

5. The process defined in claim 3 wherein the third coil directly contacts the first coil.

6. The process defined in claim 2, further comprising the step of providing both the card carrier and the module with a highly permeable material at least in said region.

7. The process defined in claim 2 wherein the second inductive coils is embodied in the module by imprinting it on the module or by laser treating the module.

8. A process for producing a chip card comprising the steps of:
   providing an opening in a card carrier;
   providing a region of the card carrier surrounding said opening with a first capacitive coupling surface;
   providing a module with a second capacitive coupling surface electrically connecting with a semiconductor chip, which is attached to the module; and
   fitting the module in the opening of the card carrier, thereby attaching the module and the card carrier to each other to wirelessly couple the first and second capacitive coupling surfaces.

9. A process for producing a chip card comprising the steps of:
   providing an opening in a card carrier;
   providing a region of the card carrier surrounding said opening with a first reactive element selected from the group consisting of a capacitor and an inductive coil;
   providing a module carrying a semiconductor chip with a second reactive element selected from the group consisting of a capacitor and an inductive; and
   fitting the module in the opening of the card carrier, thereby attaching the module and the card carrier to each other to wirelessly couple the first and second reactive elements.

10. A connecting arrangement for producing a chip card comprising:
    a card carrier having a region provided with an opening;
    a first inductive coil in the region of the card carrier;
    a module insertable in the opening so as the module and the card carrier are attached to one another;
    a semiconductor chip attached to the module, the module being provided with a second inductive coil electrically connected to the semiconductor chip, said first and second inductive coils being inductively coupled with one another upon insertion of the module in the opening of the card carrier.

11. The connection arrangement defined in claim 10 wherein the card carrier has a third inductive coil inductively coupled with the second inductive coil of the module upon insertion thereof in the opening of the card carrier, said third inductive coil being an antenna for wirelessly interconnecting the connection arrangement with the surroundings.

12. The connection arrangement defined in claim 11 wherein the third coil is continuation of the first coil.

13. The connection arrangement defined in claim 11 wherein the third coil is spaced apart from the first coil.

14. The connecting arrangement defined in claim 10 wherein the module has an outside edge, said second coil being mounted at said outside edge to act as a stiffening frame for the semiconductor chip.

15. The connecting arrangement defined in claim 10 wherein the second inductive coil is embedded in the module.

16. The connecting arrangement defined in claim 10 wherein the module has an intermediate layer provided on a surface of the module which faces away from the semiconductor chip, said intermediary layer having the second coil embedded therein.

17. The connecting arrangement defined in claim 16, further comprising a plurality of ISO contacts on an outer surface of the intermediate layer spaced from the second inductive coil.

18. A connecting arrangement for producing a chip card comprising:

a card carrier having a region provided with an opening;

a first reactive element selected from the group consisting of a capacitive coupling surface and an inductive coil;

a module insertable in the opening so as the module and the card carrier are attached to one another;

a semiconductor chip attached to the module;

a second reactive element selected from the group consisting of a capacitive coupling surface and an inductive coil provided in the module to at least partially surround and be electrically connected to the semiconductor chip, said first and second reactive elements being wirelessly coupled with one another upon insertion of the module in the opening of the card carrier.

* * * * *